[12] United States Patent  
Bartley et al.

(10) Patent No.: US 6,987,397 B2  
(45) Date of Patent: Jan. 17, 2006

(54) METHOD AND PROBE STRUCTURE FOR IMPLEMENTING A SINGLE PROBE LOCATION FOR MULTIPLE SIGNALS

(75) Inventors: Gerald Keith Bartley, Rochester, MN (US); Paul Eric Dahlen, Rochester, MN (US); Philip Raymond Germann, Rochester, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 10/682,132

(22) Filed: Oct. 9, 2003

(65) Prior Publication Data

US 2005/0077912 A1 Apr. 14, 2005

(51) Int. Cl.
*G01R 31/02* (2006.01)

(52) U.S. Cl. .................................. 324/754; 324/755

(58) Field of Classification Search ................ 324/754, 324/755, 757, 758, 765
See application file for complete search history.

(56) References Cited

U.S. PATENT DOCUMENTS

| | | | | |
|---|---|---|---|---|
| 5,014,002 A | * | 5/1991 | Wiscombe et al. | ......... 324/537 |
| 6,462,528 B1 | | 10/2002 | Markozen | |
| 6,603,323 B1 | * | 8/2003 | Miller et al. | ................. 324/754 |
| 6,747,469 B2 | * | 6/2004 | Rutten | ........................ 324/765 |

* cited by examiner

*Primary Examiner*—Vinh Nguyen  
*Assistant Examiner*—Russell M. Kobert  
(74) *Attorney, Agent, or Firm*—Joan Pennington

(57) ABSTRACT

A method and a probe structure are provided for implementing multiple signals probing of a printed circuit board. A probe structure is formed on an outside surface of the printed circuit board. A resistor is electrically connected with an associated via with a signal to be monitored. A path to a predefined probe location for monitoring the signal is defined from the resistor using the probe structure.

11 Claims, 2 Drawing Sheets

METHOD AND PROBE STRUCTURE FOR IMPLEMENTING A SINGLE PROBE LOCATION FOR MULTIPLE SIGNALS

FIELD OF THE INVENTION

The present invention relates to a method and probe structure for implementing multiple signals probing of a printed circuit board.

DESCRIPTION OF THE RELATED ART

In the testing of a printed circuit board, for example, during the initial bring up and debugging of system hardware, access to an area of interest on the printed circuit board for probing and/or connecting to signals often presents a problem.

Using a custom-designed flex cable to access mechanically constrained areas provides one possible solution to this problem. Flex cables are not integrated into the PCB, and need to be redesigned for each system packaging structure. Because custom flex cable designs are expensive, they represent a significant additional expense in addition to the procurement of the system PCB hardware.

Designers could also generally avoid this problem by designing mechanical accessibility for testing into the system. This can also be a costly alternative, as space is at a premium, both inside the system and in a customer's office.

U.S. Pat. No. 6,462,528 discloses a method and apparatus for probing a terminal of a ball grid array device, or a conductor of an array of closely-spaced conductors, using a buried tip resistor located substantially adjacent to the point to be monitored. A relatively short stub is provided from the connection point to the tip resistor. A receiver amplifier arrangement substantially eliminates an offset error that is introduced into the signal to be measured due to variation in the resistance value of the tip resistor. The buried tip resistor is made small enough to fit within a BGA pad array, and buried within the layers of a circuit board material. The disclosed probing method and apparatus if applied for multiple signals would consume significant wiring channels in the PCB that typically would be needed for functional wiring.

With trends in the computer market moving towards smaller design spaces, designers are compacting more hardware into the mechanical areas around system boards. In some cases, the system is packaged in a way which precludes access to key electrical probe locations on the PCBs while the system is functioning. For example, the use of LGA attach methods can result in cards which are packaged parallel to each other with very little space in between. Blade servers are another example where space is at a premium and testability is difficult. In such cases it is required to find ways to probe critical signals without being able to place oscilloscope probes in close proximity to the desired probing location.

A need exists for an effective method and mechanism for implementing multiple signals probing of a printed circuit board.

SUMMARY OF THE INVENTION

A principal object of the present invention is to provide a method and probe structure for implementing multiple signals probing in a printed circuit board. Other important objects of the present invention are to provide such method and probe structure for implementing multiple signals probing in a printed circuit board substantially without negative effect and that overcome many of the disadvantages of prior art arrangements.

In brief, a method and a probe structure are provided for implementing multiple signals probing of a printed circuit board. A probe structure is formed on an outside surface of the printed circuit board. A resistor is electrically connected with an associated via with a signal to be monitored. A path to a predefined probe location for monitoring the signal is defined from the resistor using the probe structure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
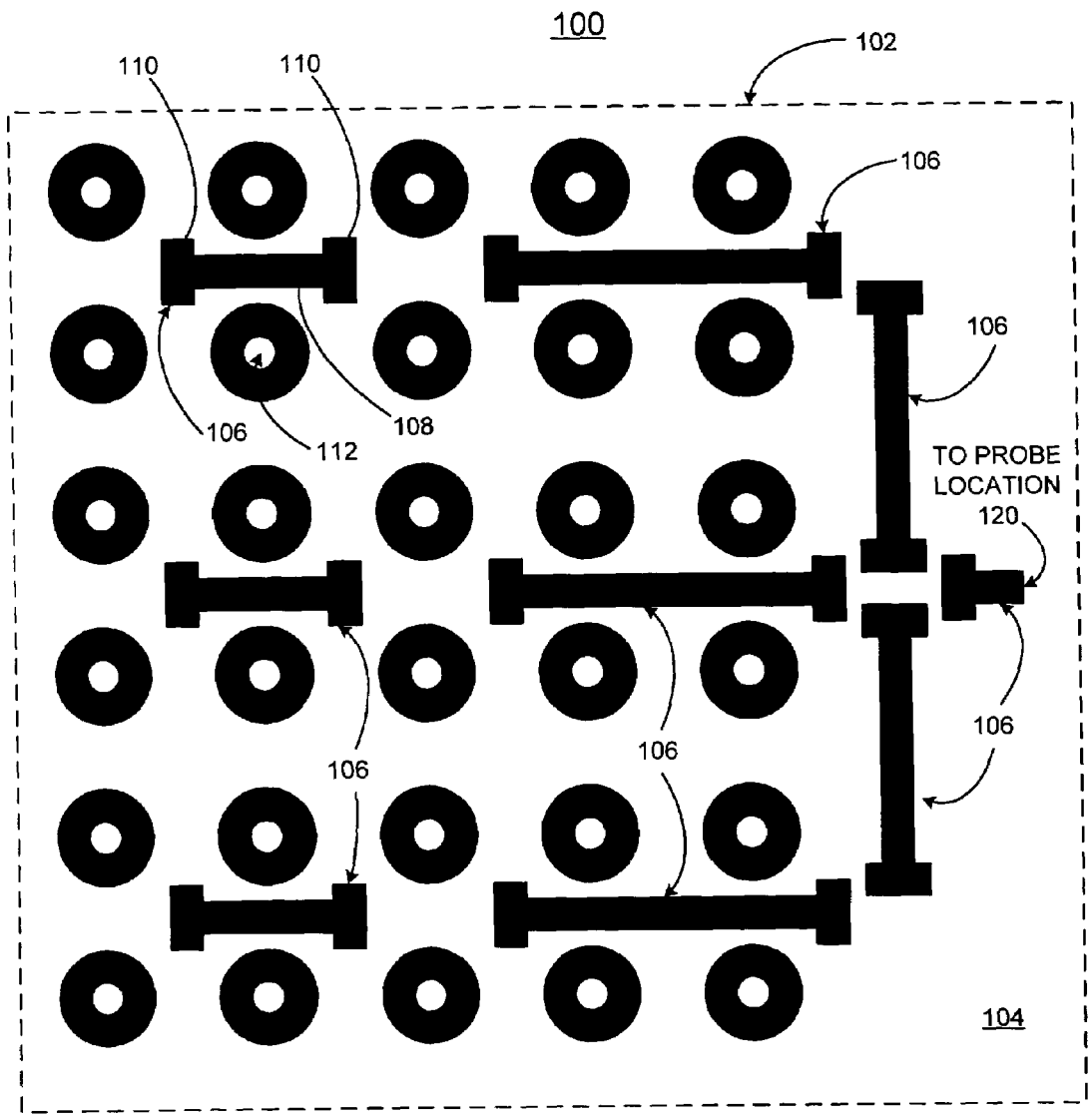
FIG. 1 is plan view illustrating an exemplary probe structure in accordance with the preferred embodiment.
Figure 2:
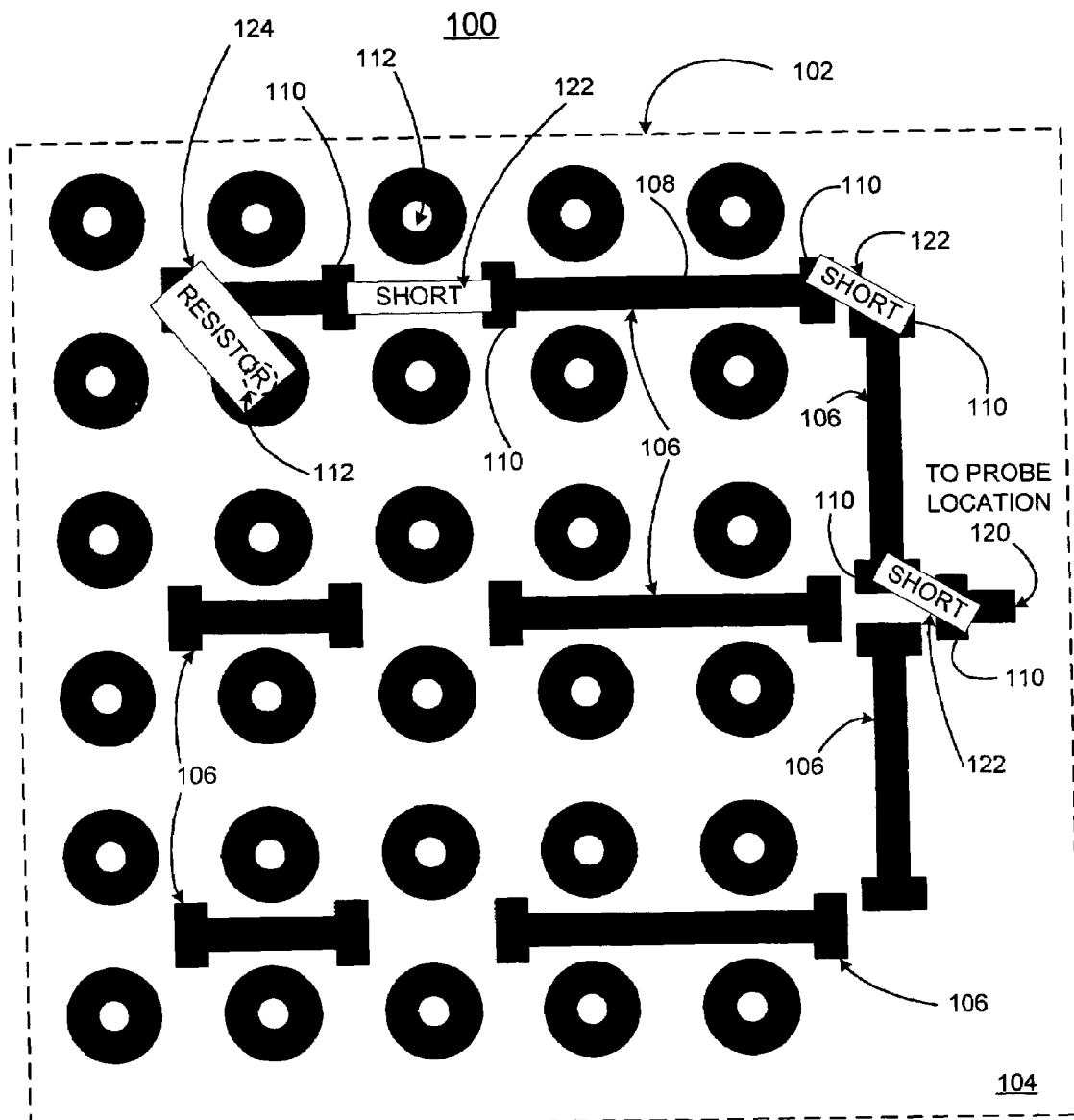
FIG. 2 is plan view illustrating signal probing with the exemplary probe structure of FIG. 1 in accordance with the preferred embodiment.

Referring now to the drawings, in FIGS. 1 and 2 there is shown an exemplary probe structure generally designated by the reference character 100 for implementing multiple signals probing in accordance with the preferred embodiment.

In accordance with features of the preferred embodiment, a method is provided to allow the observation of many signals using a single probe structure 100 that is integral with a printed circuit board 102. Using an outside surface layer 104 of the printed circuit board 102, a predefined pattern or grid of a plurality of spaced apart stubs 106 that can be, for example, an etched copper pattern, forms the probe structure 100 within a selected area of the circuit board. Each stub 106 includes an elongated portion or wiring trace 108 having a selected length and typically extending between a pair of pads 110. A pattern or array of vias 112 in the printed circuit board 102 includes selected vias 112 connected to signals of interest. Probe structure 100 includes multiple pads 110 located near the vias 112 that are connected to signals of interest.

In accordance with features of the preferred embodiment, this probe structure 100 advantageously is used to bring out any desired signal by creating a path to a probe point 120 with a respective electrical short or zero-ohm resistor 122 placed between proximate pads 110 of selected adjacent stubs 106. A resistor 124 is placed on the surface 104 of the printed circuit board 102, near the signal of interest. A desired signal of interest is tapped using a particular associated via 112 through the inserted resistor 124 and trace wiring defined by the probe structure 100 together with the shorts 122 to the predefined probe point 120 on the printed circuit board 102. In FIG. 2, the associated via 112 of the desired signal of interest tapped by the inserted resistor 124 is shown in dotted line.

Using existing card manufacturing technology, probe structure 100 is etched onto the outside layer 104 of the printed circuit board 102. With an unpopulated backside of the board 102 carrying the etched traces 108 and pads 110 of the multiple stubs 106, the electrical short or zero-ohm resistor 122 is placed across the pads 110 to create a path for the desired signal to travel out of the area of the blockage, and to a predefined probing location 120. In this way, each signal is accessible for probing using the same probe point 120.

The signal swing at the probe point will be reduced proportionally according to the values of the PCB characteristic impedance and the value of the resistor 124 chosen, but key signal features will be available for evaluation. A high resistance value of the resistor 124 as compared with the card impedance results in a probe with which one can effectively monitor activity on the signal without excessive loading. With an impedance of the printed circuit board 102 of nominally 50 ohms, for example, a resistor value of 500 ohms would result in a voltage divider, with only 10% of the signal propagating on the probe line of the probe structure 100.

In accordance with features of the preferred embodiment, this probe structure 100 presents the tapped or monitored signal at a location 120 that is more easily accessible than the location of a particular associated via 112 of the monitored signal. This probing method will not result in extra stubs of wiring on the signal of interest because the resistor 122 is used to create the tap location. Thus, the resistor 122 can be populated for debug purposes, and removed for shipping. Because probe structure 100 is integrated directly onto the printed circuit board 102, it utilizes the manufacturing processes already used to build the printed circuit board 102, and essentially no additional cost is incurred during the manufacture of the printed circuit board 102. The design of the probe structure 100 takes minimal effort during the computer aided design (CAD) layout phase of the PCB design.

It should be understood that the present invention is not limited to the illustrated embodiment. For example, one could insert more than one extraction point and probe location 120 onto the board 102, allowing the viewing of multiple signals from the area simultaneously.

While the present invention has been described with reference to the details of the embodiments of the invention shown in the drawing, these details are not intended to limit the scope of the invention as claimed in the appended claims.

What is claimed is:

1. A method for implementing multiple signals probing of a printed circuit board comprising the steps of:
   providing a pattern of vias in the printed circuit board including multiple predefined vias, each said predefined via being connected to a respective signal to be monitored;
   forming a probe structure on an outside surface of the printed circuit board including a pattern of a plurality of spaced apart electrically conductive stubs, each stub including an elongated portion extending from at least one pad, and said pattern including one of said plurality of stubs adjacent each said predefined via connected to said respective signal to be monitored;
   electrically connecting a resistor between one said predefined via connected to one said respective signal to be monitored and said adjacent stub; and
   defining a path to a predefined probe location on the printed circuit board for monitoring said signal from said resistor using said probe structure by placing zero-ohm shorts between selected ones of said pads of said plurality of stubs of said probe structure.

2. A method for implementing multiple signals probing as recited in claim 1 wherein the step of forming said pattern of said plurality of stubs includes the step of etching an electrically conductive material in said pattern of said plurality of stubs to define said probe structure on said outside surface of the printed circuit board.

3. A method for implementing multiple signals probing as recited in claim 2 wherein said electrically conductive material includes copper.

4. A method for implementing multiple signals probing as recited in claim 2 wherein the step of electrically connecting said resistor includes the step of placing said resistor between said predefined via connected to one said respective signal to be monitored and said pad of said adjacent one of said plurality of stubs of said probe structure.

5. A method for implementing multiple signals probing as recited in claim 1 wherein said resistor has a selected high resistance value relative to a characteristic impedance of the printed circuit board at said predefined via connected to one said respective signal to be monitored.

6. A method for implementing multiple signals probing as recited in claim 1 includes the steps of removing said resistor and said path after testing is completed.

7. Apparatus for implementing multiple signals probing of a printed circuit board comprising:
   a pattern of vias in the printed circuit board including multiple predefined vias, each said predefined via being connected to a respective signal to be monitored;
   a probe structure formed on an outside surface of the printed circuit board; said probe structure including an electrically conductive material forming a pattern of a plurality of spaced apart stubs defining said probe structure on said outside surface of the printed circuit board, each said stub including an elongated portion extending from at least one pad; said pattern including one of said plurality of stubs adjacent each said predefined via connected to said respective signal to be monitored;
   a resistor electrically connected between one said predefined via connected to one said respective signal to be monitored and said adjacent stub; and
   a path defined to a predefined probe location for monitoring said signal from said resistor using said probe structure; said path being formed by electrically shorting between said pads of selected ones of said plurality of spaced apart stubs.

8. Apparatus for implementing multiple signals probing as recited in claim 7 wherein said resistor and said path are removed after testing is completed.

9. Apparatus for implementing multiple signals probing as recited in claim 7 wherein said probe structure formed on said outside surface of the printed, circuit board includes an electrically conductive material etched to define a grid of a plurality of spaced apart stubs defining said probe structure.

10. Apparatus for implementing multiple signals probing as recited in claim 9 wherein said electrically conductive material is copper.

11. Apparatus for implementing multiple signals probing as recited in claim 7 wherein said resistor has a selected high resistance value relative to a characteristic impedance of the printed circuit board at said predefined via connected to one said respective signal to be monitored.

* * * * *